United States Patent
Ohori et al.

[11] Patent Number: 5,990,555
[45] Date of Patent: Nov. 23, 1999

[54] ELECTRONIC CIRCUIT DEVICE WITH MULTI-LAYER WIRING

[75] Inventors: Tatsuya Ohori; Tetsurou Hori, both of Kawasaki, Japan

[73] Assignee: Fujitsu Limited, Kawasaki, Japan

[21] Appl. No.: 08/733,742

[22] Filed: Oct. 18, 1996

[30] Foreign Application Priority Data

May 14, 1996 [JP] Japan .................................... 8-119304

[51] Int. Cl.⁶ .......................... H01L 29/76; H01L 23/48; H01L 23/52
[52] U.S. Cl. .......................... 257/750; 257/773; 257/774; 257/758; 257/760; 257/381; 257/382; 257/637
[58] Field of Search .................................. 257/381–382, 257/637–641, 758, 760, 773–774

[56] References Cited

U.S. PATENT DOCUMENTS

| | | | |
|---|---|---|---|
| 4,767,724 | 8/1988 | Kim et al. | 257/760 |
| 4,900,695 | 2/1990 | Takahashi et al. | 257/774 |
| 4,943,539 | 7/1990 | Wilson et al. | 257/774 |
| 5,068,711 | 11/1991 | Mise | 257/760 |
| 5,523,257 | 6/1996 | Yamazaki et al. | 438/163 |
| 5,581,102 | 12/1996 | Kusumoto | 257/347 |
| 5,616,960 | 4/1997 | Noda et al. | 257/774 |
| 5,621,224 | 4/1997 | Yamazaki et al. | 257/66 |
| 5,668,379 | 9/1997 | Ono et al. | 257/347 |

FOREIGN PATENT DOCUMENTS

| | | | |
|---|---|---|---|
| 358153667 | 8/1983 | Japan | 257/774 |
| 58-135667 | 8/1983 | Japan | 257/774 |
| 402158132 | 6/1990 | Japan | 257/774 |
| 7-22507 | 1/1995 | Japan . | |

Primary Examiner—Mahshid Saadat
Assistant Examiner—Jhihan B. Clark
Attorney, Agent, or Firm—Armstrong, Westerman, Hattori, McLeland & Naughton

[57] ABSTRACT

An electronic circuit having: a substrate with an upper surface; a lower level wiring made of conductive material and disposed on the substrate; an insulating cover film covering the surface of the lower level wiring; an interlayer insulating film formed on the substrate, covering the insulating cover film; an opening formed through the interlayer insulating film and the insulating cover film at an interlayer contact region extending from an area corresponding to the inside region, as viewed in the in-plane layout of the substrate, of the lower level wiring to an area corresponding to the outside region of the lower level wiring; and a higher level wiring disposed on a partial region of the interlayer insulating film and in the interlayer contact region, the higher level wiring being electrically connected to the lower level wiring in the interlayer contact region. The connection reliability between a lower level wiring layer and a higher level wiring layer in the connection region can be improved while maintaining the insulation reliability therebetween in the insulation region.

9 Claims, 8 Drawing Sheets

ELECTRONIC CIRCUIT DEVICE WITH MULTI-LAYER WIRING

BACKGROUND OF THE INVENTION a) Field of the Invention

The present invention relates to an electronic circuit device with multi-layer wiring and its manufacture, and more particularly to an electronic circuit device having an interlayer insulating film formed on an insulating film covering the surface of the underlying wiring layer.

b) Description of the Related Art

Figure 8:
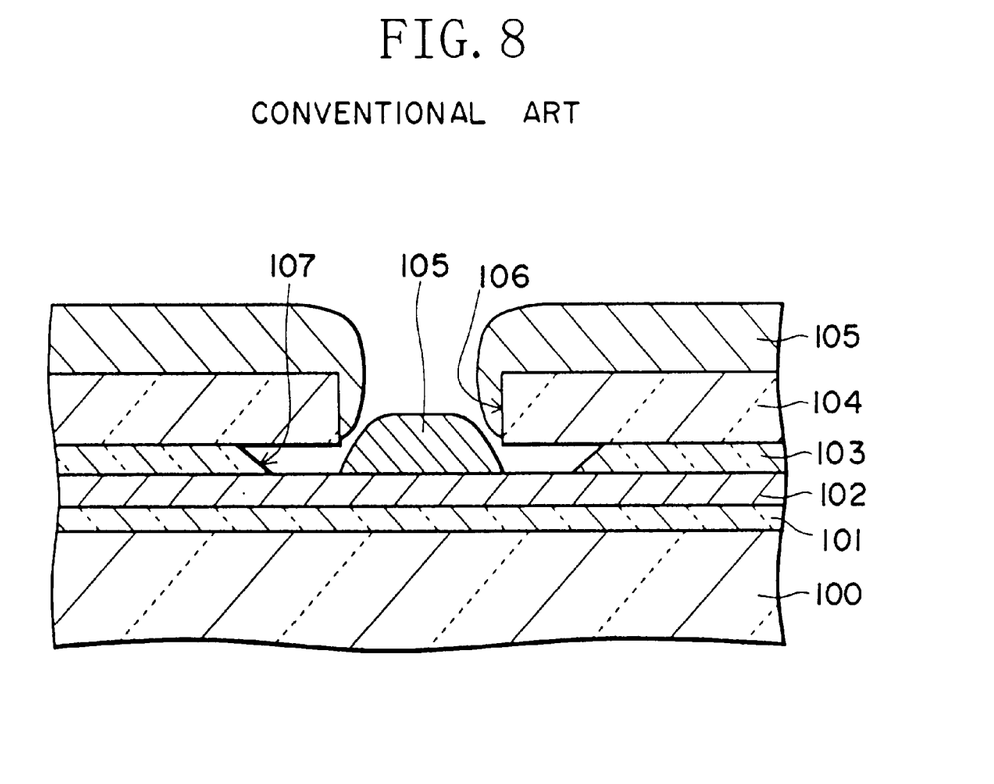
FIG. 8 is a cross sectional view showing the connection portion between a gate line and a drain line of a TFT type LCD according to a conventional example.

FIG. 8 is a cross sectional view showing the connection portion between a lower level wiring layer and a higher level wiring layer of a liquid crystal display (LCD) panel with thin film transistors (TFTs).

On the surface of a glass substrate 100, a gate insulating film 101 is formed. In the region where a TFT is formed, a polysilicon film is formed between the glass substrate 100 and gate insulating film 101. In this polysilicon film, a channel region, a source, and a drain region of TFT are formed. Since FIG. 8 shows the connection portion between the lower and higher level wiring layers, the polysilicon film is not shown in this portion.

A gate wiring line 102 of aluminum is formed on the gate insulating film 101. The gate wiring line 102 is patterned at the same time when the gate electrode of TFT is patterned. The surface of the gate wiring line 102 is covered with an anodic oxide film 103 formed through anodic oxidation of aluminum. An interlayer insulating film 104 is formed over the substrate including the surface of the anodic oxide film 103.

A drain wiring line 105 of aluminum is formed on the interlayer insulating film 104. The drain wiring line 105 is deposited and patterned at the same time when the drain electrode of TFT is deposited and patterned. The gate wiring line 102 and drain wiring line 105 are disposed in a lattice shape in the area where pixels are formed. Both the wiring lines are electrically insulated at their cross points by the interlayer insulating film 104. The anodic oxide film 103 improves the insulation reliability between the gate wiring lines 102 and drain wiring lines 105.

In some cases, in an LCD with built-in peripheral circuits, an output signal of one transistor of the peripheral circuit drives another transistor, by connecting the drain wiring line of the one transistor at the preceding stage to the gate wiring line of the other transistor at the succeeding stage.

In connecting the gate wiring line and drain wiring line, a contact hole 106 is formed in the interlayer insulating film 104 and anodic oxide film 103 before the drain wiring layer is deposited. The contact hole 106 in the interlayer insulating film 104 is formed through anisotropic etching.

The anodic oxide film 103 is etched by isotropic wet etching using, for example, chromium mixed acid ($CrO_3 \cdot HNO_3 \cdot H_3PO_4 \cdot CH_3COOH+nH_2O$), because there is no etching gas having a large etching selection ratio to the gate wiring layer 102. Therefore, the anodic oxide film 103 is side etched, leaving a hollow 107 at the lower side wall of the contact hole 106.

After the contact hole 106 is formed, the drain wiring layer is deposited over the whole surface of the substrate by sputtering or the like. Since the hollow 107 is formed at the lower side wall of the contact hole 106, step coverage of the drain wiring line at the contact hole lowers so that breakage or disconnection of the drain wiring line becomes likely to occur. The anodic oxide film for preventing a short circuit between the gate wiring line and drain wiring line in the region where pixels are formed, makes it difficult to connect the gate wiring line and drain wiring line at the region where peripheral circuits are formed.

As above, although the surface of the gate wiring layer is formed with an anodic oxide film in order to improve the insulation reliability between the gate wiring line and drain wiring line in the pixel forming region, this anodic oxide film lowers the connection reliability between the gate and drain wiring lines in the region where the peripheral circuits are fabricated.

SUMMARY OF THE INVENTION

It is an object of the present invention to provide an electronic circuit device capable of improving the connection reliability between a lower level wiring line and a higher level wiring line in the connection region while maintaining the insulation reliability therebetween in the insulation region, and to provide its manufacture method.

According to one aspect of the present invention, there is provided an electronic circuit device comprising: a substrate with an upper surface; a lower level wiring made of conductive material and disposed on the substrate; an insulating cover film covering the surface of the lower level wiring; an interlayer insulating film formed on the substrate, covering the insulating cover film; an opening formed through the interlayer insulating film and the insulating cover film at an interlayer contact region extending from an area corresponding to the inside region, as viewed in the in-plane layout of the substrate, of the lower level wiring to an area corresponding to the outside region of the lower level wiring; and a higher level wiring disposed on a partial region of the interlayer insulating film and in the interlayer contact region, the higher level wiring being electrically connected to the lower level wiring in the interlayer contact region.

When the opening is formed in the insulating cover film, the insulating cover film is side etched in some cases. If the insulating cover film is side etched, a retracted portion or hollow is formed in the side wall of the opening and the step coverage of the higher level wiring is lowered. The opening is formed extending to an area corresponding to the outside region of the lower level wiring, as viewed in the in-plane layout of the substrate. Since the insulating cover film is not formed in an area corresponding to the outside region of the lower level wiring, the insulating cover film does not appear at the inner side wall of the opening. Accordingly, the retracted portion or hollow is not formed in this area at the inner side wall so that the step coverage can be prevented from being lowered.

According to another aspect of the present invention, there is provided a method of manufacturing an electronic circuit device comprising the steps of: forming a lower level metal wiring on an upper surface of a substrate; forming an anodic oxide film by anodically oxidizing the surface of the lower level metal wiring; forming an interlayer insulating film over the substrate, covering the anodic oxide film; forming a mask pattern with an opening on the interlayer insulating film, the opening riding upon two regions, one region corresponding to the region where the lower level metal wiring is formed and the other region corresponding to the region where the lower level metal wiring is not formed; by using the mask pattern as an etching mask, etching the interlayer insulating film to form a contact hole and partially expose the anodic oxide film in the contact hole; etching the anodic oxide film exposed in the contact hole to partially expose the lower level metal wiring; and forming a higher level wiring on the interlayer insulating film and in the contact hole, the higher level wiring being electrically connected to the lower level metal wiring.

When the contact hole is formed by etching the anodic oxide film, the anodic oxide film is side etched in some cases. If the anodic oxide film is side etched, a retracted portion or hollow is formed in the side wall of the opening and the step coverage of the higher level wiring is lowered. If the contact hole is formed extending to an area corresponding to the outside region of the lower level wiring, the anodic oxide film does not appear at the inner side wall of the contact hole in this area corresponding to the outside region of the lower level wiring. Accordingly, the retracted portion or hollow is not formed at the inner side wall so that the step coverage can be prevented from being lowered.

According to a further aspect of the present invention, there is provided an electronic circuit device comprising: a substrate with an upper surface; a lower level wiring made of conductive material and disposed on the substrate; an insulating cover film covering the surface of the lower level wiring; an interlayer insulating film formed on the substrate, covering the insulating cover film; an opening formed through the interlayer insulating film and the insulating cover film in a partial area corresponding to the inside region, as viewed in the in-plane layout of the substrate, of the lower level wiring, the portion exposing the insulating cover film at the inner side wall of the opening is retracted from the portion exposing the interlayer insulating film; a buried material formed on the side wall of the opening, the buried material burying at least the whole region of the retracted portion of the insulating cover film; and a higher level wiring disposed on the interlayer insulating film, in the opening, and on the surface of the buried material, the higher level wiring being made of different material from the buried material and electrically connected to the lower level wiring in the opening.

The retracted portion at the side wall of the opening is buried with the burying material so that the step coverage of the higher level wiring can be prevented from being lowered.

According to a still further aspect of the present invention, there is provided a method of manufacturing an electronic circuit device comprising the steps of: forming a lower level metal wiring on an upper surface of a substrate; forming an anodic oxide film by anodically oxidizing the surface of the lower level metal wiring; forming an interlayer insulating film on the substrate, covering the anodic oxide film; forming a mask pattern with an opening on the interlayer insulating film, the opening being formed in a partial area corresponding to the region where the lower level metal wiring is formed; by using the mask pattern as an etching mask, etching the interlayer insulating film to form a contact hole and partially expose the anodic oxide film in the contact hole; isotropically etching the anodic oxide film exposed in the contact hole; depositing a buried film over the substrate surface including a retracted portion formed through side etch of the anode oxide film, the buried film having a thickness equal to or larger than the depth of the retracted portion; depositing a higher level wiring layer at least covering the surface of the buried film, the higher level wiring layer being made of material different from the buried film and electrically connected to the lower level metal wiring at the contact hole; and patterning the higher level wiring layer to form a higher level wiring pattern, wherein the buried film is made of metal more likely to migrate during the metal film formation than the higher level wiring layer.

The retracted portion at the side wall of the opening is buried with the burying material so that the step coverage of the higher level wiring can be prevented from being lowered.

As above, in the case of covering the surface of the lower level wiring with an insulating film and forming the higher level wiring on the insulating film with the interposed interlayer insulating film, a contact hole formed in the above manner in the interlayer insulating film and the insulating film on the lower level wiring ensures the reliable connection between the higher level wiring and the lower level wiring.

DETAILED DESCRIPTION OF THE PREFERRED EMBODIMENTS

The structure of a TFT type LCD and its manufacture method according to the first embodiment of the invention will be described with reference to FIGS. 1 to 5.

Figure 1:
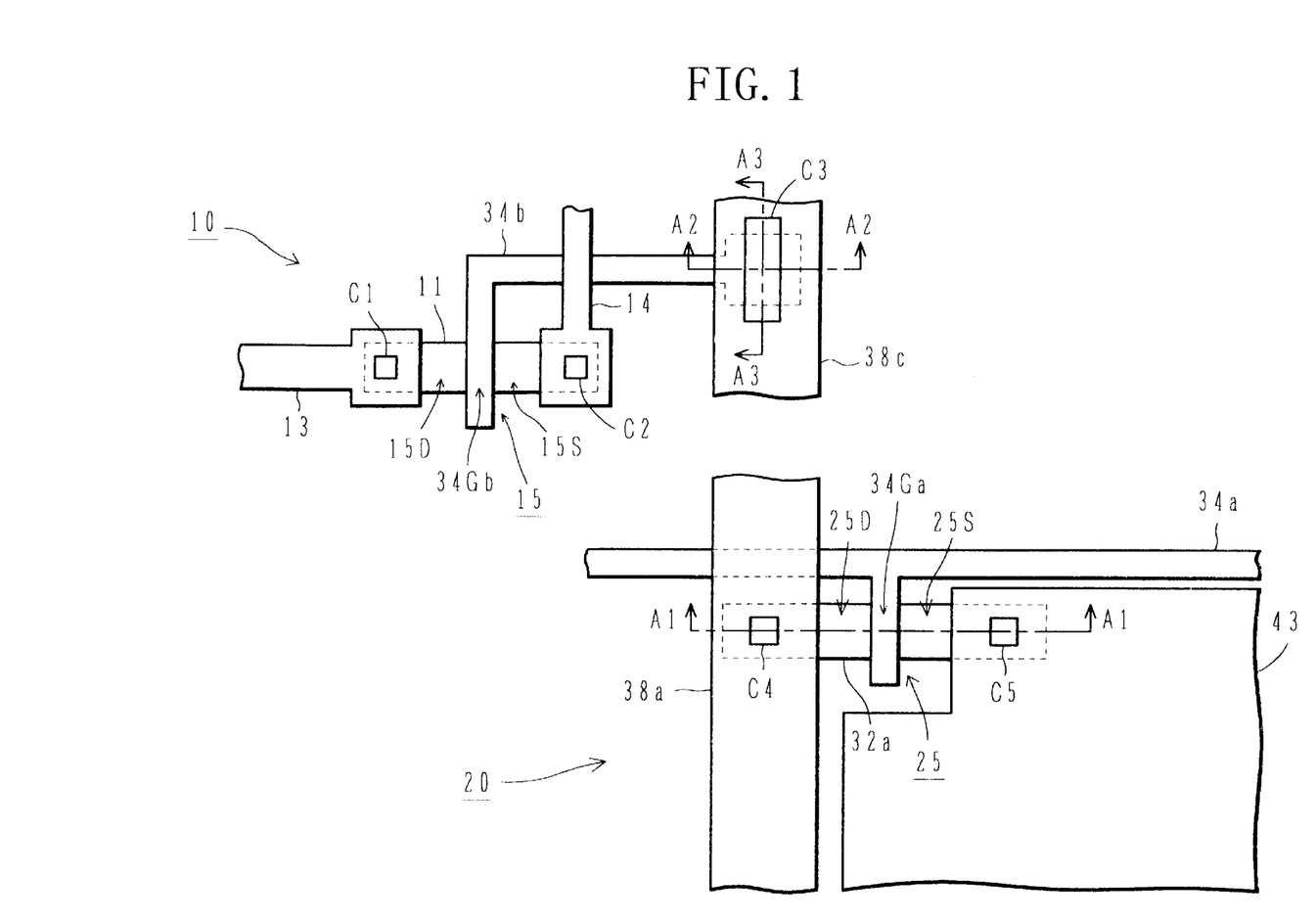
FIG. 1 is a partial plan view of a TFT type LCD according to a first embodiment of the present invention.

FIG. 1 is a partial plan view showing a TFT type LCD of the first embodiment. TFT type LCD has a peripheral circuit portion 10 and a pixel portion 20.

In the pixel portion 20, a gate line 34a extending in the horizontal direction as viewed in FIG. 1 and a drain line 38a extending in the vertical direction are disposed in a lattice shape. The gate line 34a and drain line 38a are made of, for example, aluminum and electrically separated by an interlayer insulating film at their cross points.

A TFT 25 is disposed near at the cross point between the gate line 34a and drain line 38a. TFT 25 is constituted by a rectangular polysilicon film 32a and a gate electrode 34Ga formed on the polysilicon film 32a with a gate insulating film being interposed therebetween. The gate electrode 34Ga is contiguous with the gate line 34a. Impurities are doped in the polysilicon film 32a at both sides of the gate electrode 34Ga to define a drain region 25D and a source region 25S. The impurities may be phosphorus (P) for n-type and boron (B) for p-type.

The drain region 25D is connected to the drain line 38a via a contact hole C4. The source region 25S is connected via a contact hole C5 to a transparent pixel electrode 43 made of, for example, indium tin oxide (ITO).

In the peripheral circuit portion 10, a TFT 15 is formed. TFT 15 has a fundamental structure same as that of TFT 25 and is constituted by a polysilicon film 11 and a gate electrode 34Gb. The gate electrode 34Gb is contiguous with a gate line 34b, and the gate line 34b is connected via a contact hole C3 to a drain line 38c. The contact hole C3 partially extends to the outside region of the gate line 34b.

The drain region 15D is connected via a contact hole C1 to an upper wiring line 13, and the source region 15S is connected via a contact hole C2 to an upper wiring line 14.

A method of manufacturing an LCD will be described with reference to FIGS. 2A to 2D and FIGS. 3 to 5. FIGS. 2A to 5 are partial cross sectional views of LCD shown in FIG. 1. In each drawing, the left, center, and right portions correspond to cross sectional views taken along one-dot chain lines A1—A1, A2—A2, and A3—A3 of FIG. 1 respectively.

Figure 2A:
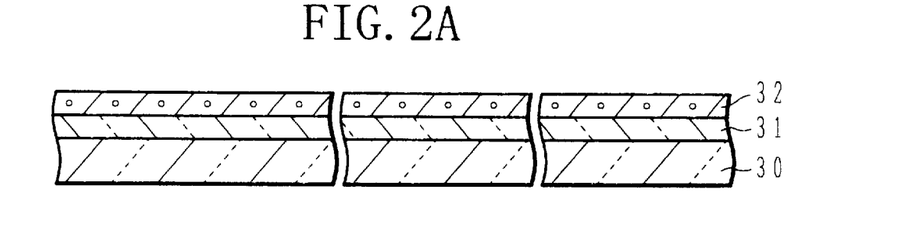
FIGS. 2A to 2D, and FIGS. 3 to 5 are cross sectional views of a substrate illustrating a method of manufacturing the TFT type LCD of the first embodiment.

As shown in FIG. 2A, on a transparent glass substrate 30, an underlie $SiO_2$ film 31 is deposited to a thickness of 200 nm by plasma-enhanced chemical vapor deposition (PE-CVD) using silane ($SiH_4$) and oxygen ($O_2$) as source gas. On the underlie $SiO_2$ film 31, an amorphous silicon film is deposited to a thickness of 50 nm by PE-CVD using hydrogen ($H_2$) diluted $SiH_4$ as source gas. After the amorphous silicon film is deposited, it is crystallized through laser annealing using excimer laser at an energy density of 250 $mJ/cm^2$ to form a polysilicon film 32.

Figure 2B:
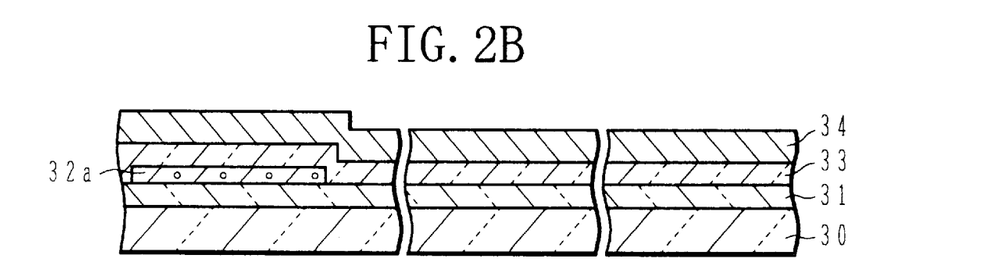

As shown in FIG. 2B, the polysilicon film 32 is patterned leaving a polysilicon film 32a at the region where TFT 25 of FIG. 1 is formed. At this time, the polysilicon film 11 is also left at the region where TFT 15 shown in FIG. 1 is formed. The polysilicon film 32 is patterned, for example, by reactive ion etching (RIE) using $CF_4$ as etching gas.

A gate insulating film 33 of $SiO_2$ is deposited to a thickness of 150 nm by PE-CVD over the whole surface of the substrate, covering the polysilicon film 32a. On the gate insulating film 33, a gate wiring layer 34 of Al is deposited to a thickness of 300 nm by sputtering.

Figure 2C:
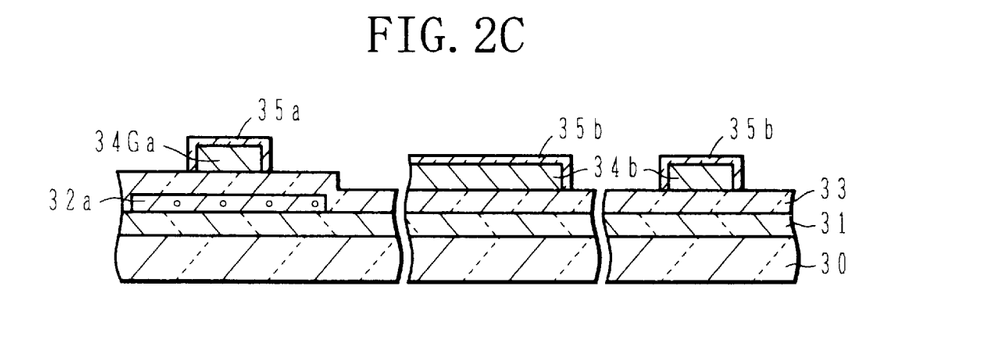

As shown in FIG. 2C, the gate wiring layer 34 is patterned to leave the gate electrode 34Ga above a partial region of the polysilicon film 32a and to leave the gate line 34b at the region where a wiring line is formed. At this time, the gate line 34a and gate electrode 34Gb shown in FIG. 1 are also formed. The gate wiring layer 34 is patterned, for example, by RIE using mixed gas of $Cl_2$ and $BCl_3$ as etching gas.

The substrate is immersed in oxalic acid $((COOH)_2 2H_2O)$ to anodically oxidize the surface of the gate electrode 34Ga and gate line 34b to form anodic oxide films 35a and 35b of $Al_2O_3$ having a thickness of 120 nm. The other gate electrode and gate line are also covered with the anodic oxide film.

Figure 2D:
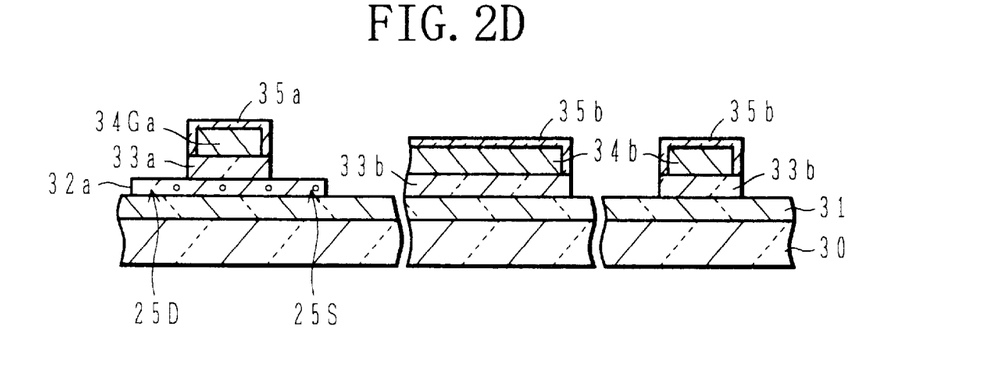

As shown in FIG. 2D, by using the anodic oxide films 35a and 35b as an etching mask, the gate insulating film 33 is etched by RIE using $CHF_3$ as etching gas. The etching is stopped when the surface of the polysilicon film 32a at both sides of the gate electrode 34Ga is exposed.

By using the gate electrode 34Ga and anodic oxide film 35a as a mask, impurity ions are implanted into the polysilicon film 32a. The region where n-channel type TFT is formed is covered with a resist pattern and $B^+$ ions are implanted. After this resist pattern is removed, the region where p-channel TFT is formed is covered with another resist pattern and $P^+$ ions are implanted. Complementary MOS (CMOS) circuits can therefore be formed. After ions are implanted, the resist pattern is removed to perform annealing for activation. The ion implanted regions of the polysilicon film 32a become the drain region 25D and source region 25S.

Figure 3:
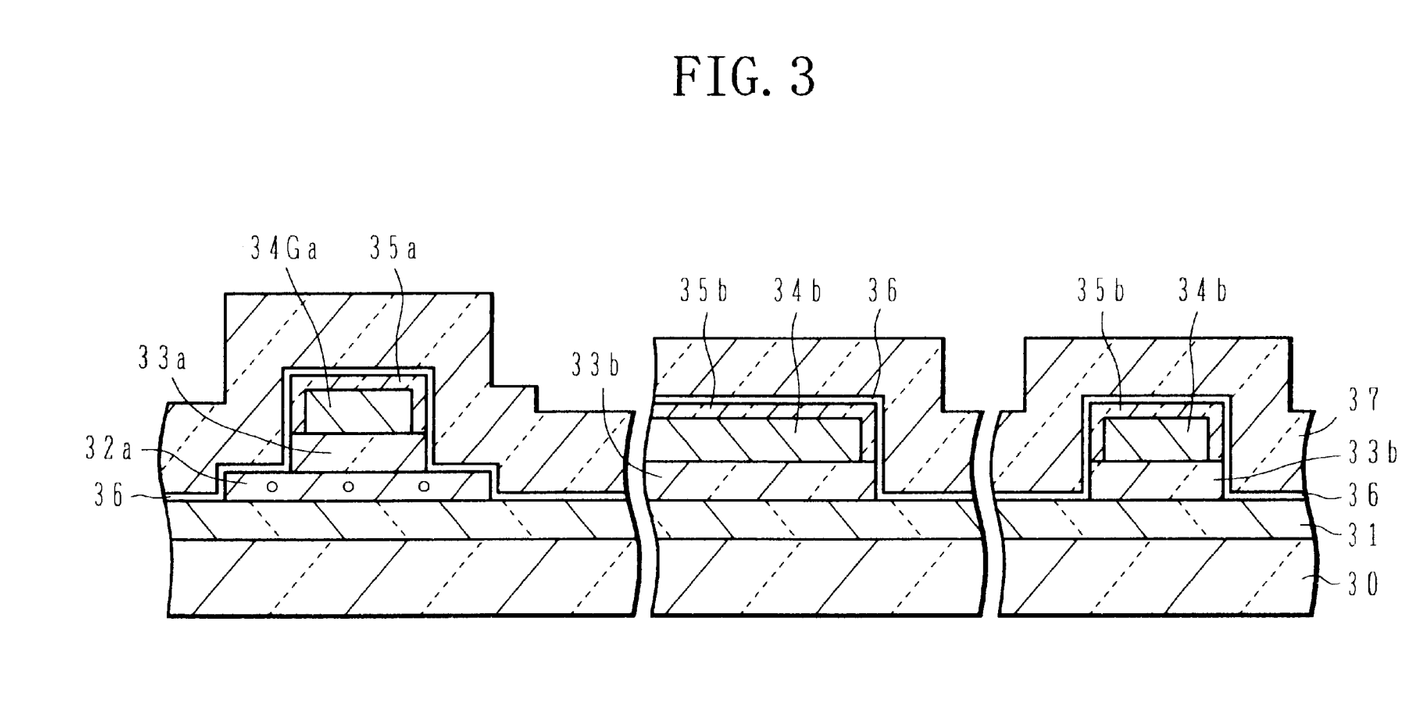

As shown in FIG. 3, an etching stopper layer 36 of $SiO_2$ is deposited over the whole surface of the substrate. On the etching stopper layer 36, an interlayer insulating film 37 of SiN is deposited to a thickness of 250 nm by PE-CVD using $H_2$ diluted $SiH_4$ and $NH_3$ as source gas.

Figure 4:
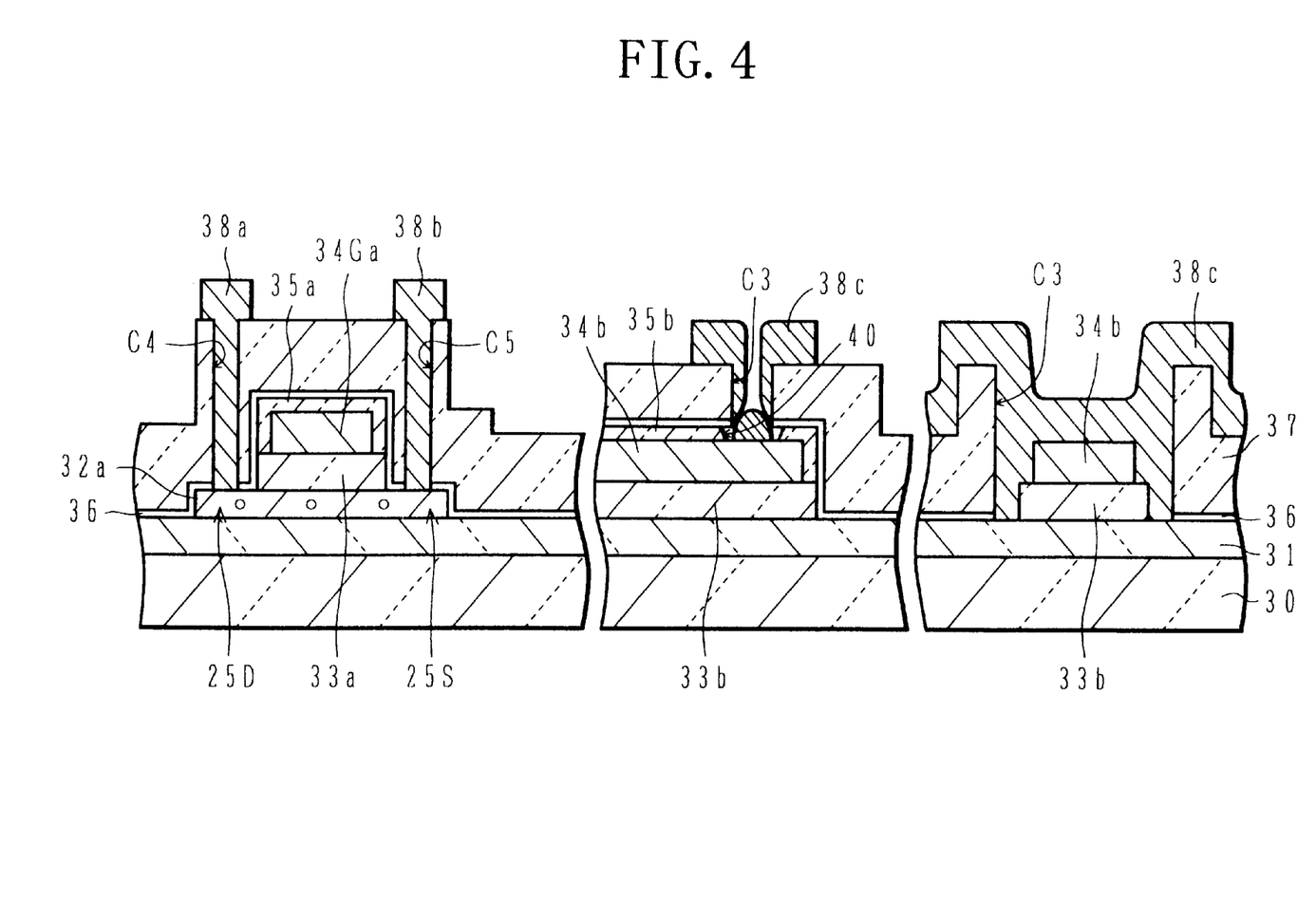

As shown in FIG. 4, the contact holes C3, C4, and C5 are formed in the interlayer insulating film 37, etching stopper layer 36, and anodic oxide film 35b. The surfaces of the drain region 25D and source region 25S are partially exposed at the bottom of the contact holes C4 and C5, and the surfaces of the gate line 34b, gate insulating film 33b, and underlie $SiO_2$ film 31 are partially exposed in the contact hole C3.

A contact hole is formed in the SiN interlayer insulating film 37, for example, by RIE using $CF_4$ as etching gas. This etching automatically stops at the $SiO_2$ etching stopper layer 36. A contact hole in the etching stopper layer 36 is formed, for example, by wet etching using hydrofluoric acid aqueous solution. With this etching, the surfaces of the drain region 25D and source region 25S are partially exposed at the bottoms of the contact holes C4 and C5. In the contact hole C3, the surfaces of the anodic oxide film 35b and underlie $SiO_2$ film 31 are partially exposed at the bottom of the contact hole C3.

Since the etching of the interlayer insulating film 37 stops at the etching stopper layer 36, the surfaces of the drain region 25D and source region 25S of the polysilicon film 32a are not exposed to etching gas of RIE. A contact hole in the etching stopper layer 36 Just above the drain region 25D and source region 25S is formed by wet etching. It is therefore possible to prevent contamination of the surfaces of the drain region 25D and source region 25S.

The etching stopper layer 36 is sufficiently thin as compared to the underlie $SiO_2$ film 31. Therefore, even if excessive etching is performed for the etching stopper layer 36, the underlie $SiO_2$ film 31 at the bottom of the contact hole C3 is less affected. In this connection, even if the etching stopper layer 36 is not formed and excessive etching is performed for the interlayer insulating film 37, the underlie $SiO_2$ film 31 exposed at the bottom of the contact hole C3 is less affected because the etching resistance is different between the interlayer insulating film 37 and underlie $SiO_2$ film 31.

Next, the anodic oxide film 35b exposed at the bottom of the contact hole C3 is etched by wet etching using chromium mixed acid. As shown in the center portion of the cross sectional view of FIG. 4, the anodic oxide film 35b is side etched at the lower side wall of the contact hole C3 at the area corresponding to the inside region of the gate line 34b, as viewed in the in-plane layout of the substrate. Therefore, a hollow 40 is formed at the lower side wall of the contact hole C3.

As shown in the right portion of the cross sectional view of FIG. 4, the anodic oxide film 35b on the surface of the gate wiring pattern 34b is completely removed, and the gate insulating film 33b and underlie $SiO_2$ film 31 are partially exposed on both sides of the gate line 34b.

A drain wiring layer is deposited over the whole surface of the substrate by sputtering so as to fill each contact hole with the drain wiring layer which is made of three layers of Ti/Al/Ti. The thickness of each of the upper and lower Ti layers is about 100 nm, and that of the Al layer is 200 nm. The lower Ti layer prevents interdiffusion between Al and polysilicon, and Al layer and interlayer insulating layer 37, and the upper Ti layer is used as an anti-reflection film for photolithography. This drain wiring layer is patterned to form a drain line 38a connected to the drain region 25D via the contact hole C4 filled with the drain wiring layer, a source lead line 38b connected to the source region 25S via the contact hole C5 filled with the drain wiring layer, and a drain line 38c connected to the gate line 34b via the contact hole C3 filled with the drain wiring layer.

In the center portion of the cross sectional view of FIG. 4, the hollow 40 is formed at the lower side wall of the contact hole C3 so that the step coverage of the drain line 38c becomes poor. In contrast, in the right portion of the cross sectional view of FIG. 4, no hollow is formed in the inner wall of the contact hole C3 so that the step coverage is prevented from being lowered. The gate line 34b and drain line 38c are connected stably at the area corresponding to the outside region of the gate line 34b in the contact hole C3 so that the connection reliability can be prevented from being deteriorated.

Figure 5:
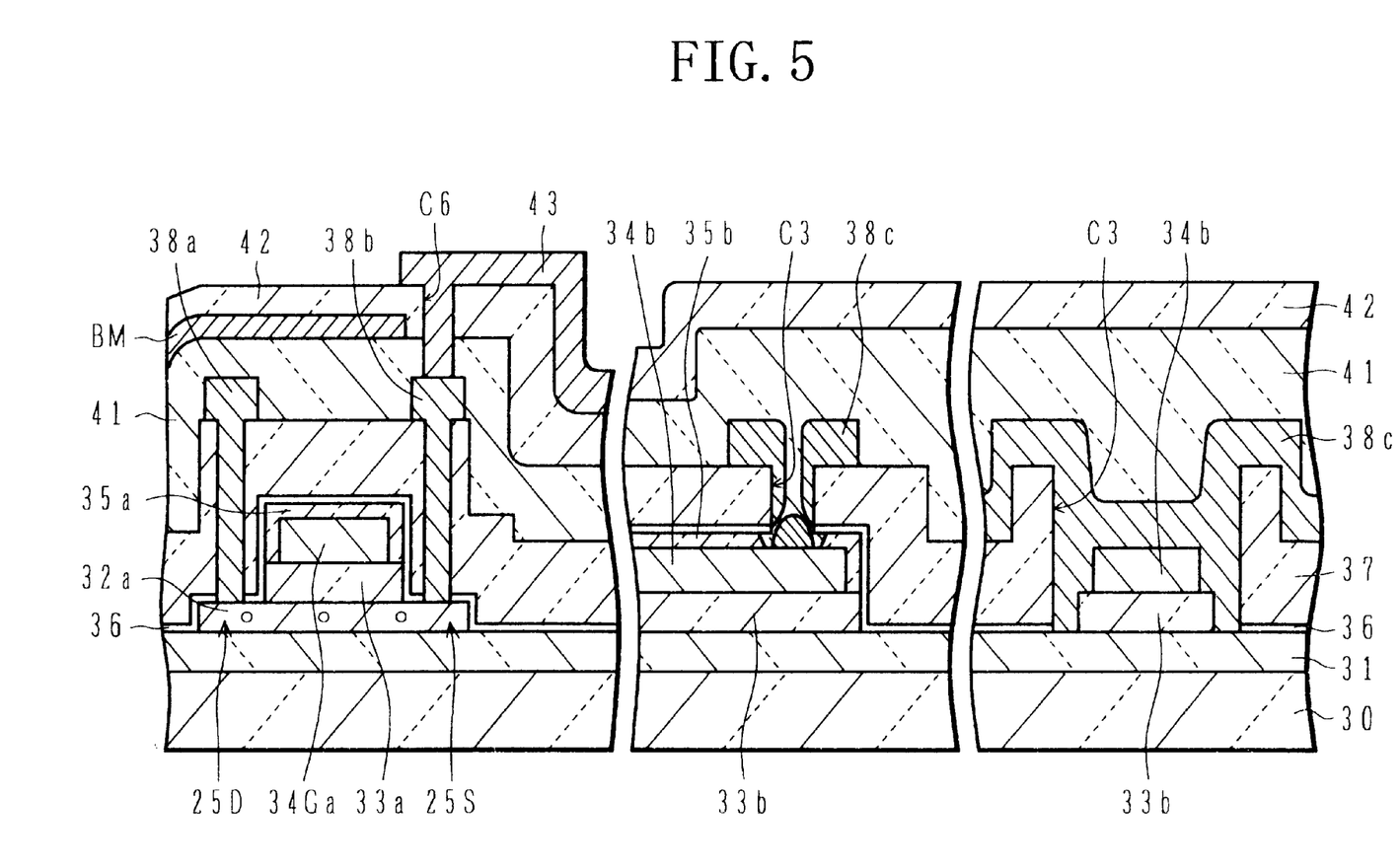

As shown in FIG. 5, an interlayer insulating film 41 of SiN is deposited to a thickness of 200 nm by PE-CVD over the whole surface of the substrate. A Ti film is deposited on the interlayer insulating film 41, and patterned to form a black matrix BM at a predetermined area.

An interlayer insulating film 42 of SiN is deposited to a thickness of 300 nm by PE-CVD, covering the black matrix BM and interlayer insulating film 41. A contact hole is formed in the interlayer insulating films 42 and 41 to expose the upper surface of the source lead line 38b. An ITO film is deposited to a thickness of 150 nm over the whole surface of the substrate, burying the contact hole C6. A predetermined surface area of this ITO film is covered with a mask pattern, and the exposed area of the ITO film is etched, for example, by oxalic acid. A transparent pixel electrode 43 is therefore formed which is connected to the source lead line 38b via the contact hole C6.

In the above embodiment, the contact hole is formed partially extending to the outside region of the gate line to thereby improve the reliability of the connection portion between the gate line and drain line. In addition, since the surface of the gate line is covered with the anodic oxide film, the insulation reliability of the gate line and drain line can be maintained high at the pixel portion 20 shown in FIG. 1.

A modification of the first embodiment will be described with reference to FIG. 6.

Figure 6:
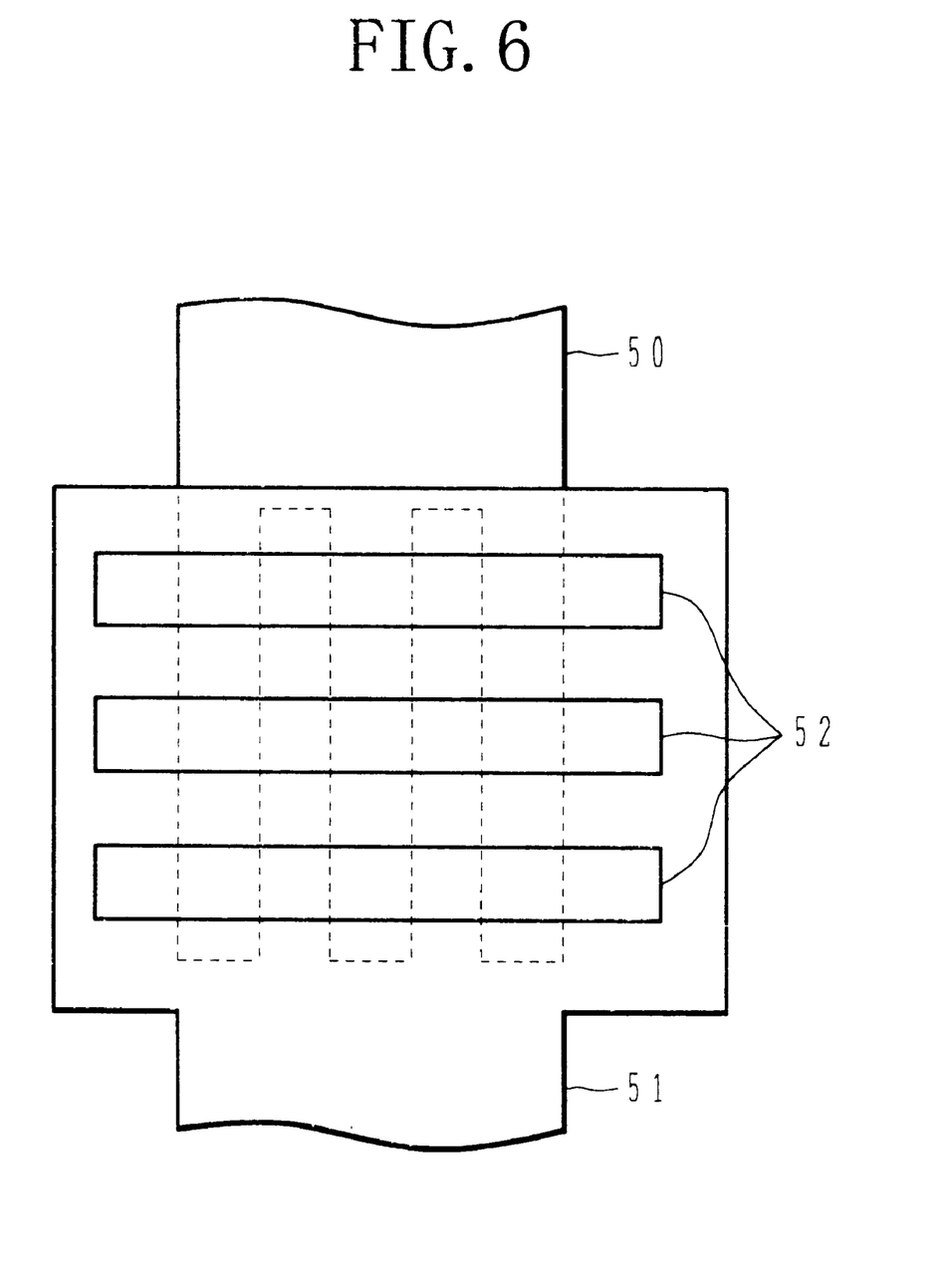
FIG. 6 is a plan view showing the connection portion between a gate line and a drain line according to a modification of the first embodiment.

FIG. 6 is a plan view showing the connection portion of the gate line and drain line according to a modification of the first embodiment. The end portion of the gate line 50 has a comb-teeth pattern. The end portion of the drain line 51 is disposed covering the comb-teeth pattern area of the gate line 50, with an interlayer insulating film being interposed therebetween. A plurality of elongated contact holes 52 are formed in the interlayer insulating film, intersecting with each tooth of the comb-teeth pattern of the gate line 50.

At the area of the contact hole 52 not overlapping with the gate line, the inner side wall without a hollow such as shown in the right portion of the cross sectional view of FIG. 5 can be formed. As shown in FIG. 6, by forming the gate line of a comb-teeth pattern and disposing a plurality of contact holes intersecting with each tooth of the comb-teeth pattern, the total length of the inner side wall of the contact hole without a hollow can be elongated. Therefore, the connection portion between the higher and lower wiring layers can be made broad in the contact hole 52, and the contact resistance can be lowered.

The configuration of the connection portion such as shown in FIG. 6 is effective for the connection of a power source line flowing large current.

In the example shown in FIG. 6, the drain line is connected to the gate line at the end portion. If the drain line is connected at the intermediate portion of the gate line, slits may be formed in the gate line to form a stripe pattern, and contact holes intersecting with these stripes may be formed. This configuration also provides similar advantageous effects.

Next, the structure of a connection portion between a higher level wiring line and a lower level wiring line and its manufacturing method according to the second embodiment of the invention will be described with reference to FIG. 7A.

Figure 7A:
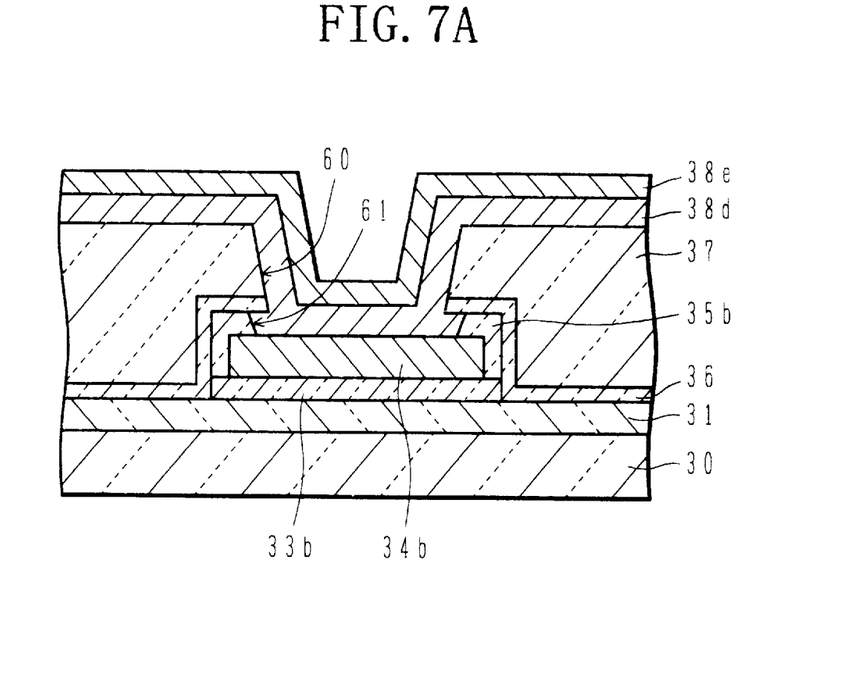
FIGS. 7A and 7B are cross sectional views showing the connection portion between a gate line and a drain line of a TFT type LCD according to a second embodiment and a modification thereof.

FIG. 7A is a cross sectional view showing the connection portion of a gate line and a drain line. Each element in FIG. 7A is represented by using identical reference numeral with the corresponding element in FIG. 4.

On the surface of a glass substrate 30, an underlie $SiO_2$ film 31 is deposited. A gate insulating film 33b is formed partially on the underlie $SiO_2$ film 31. A gate line 34b is formed on the gate insulating film 33b, and the surface thereof is covered with an anodic oxide film 35b.

An etching stopper layer 36 is formed covering the surfaces of the anodic oxide film 35b, gate insulating film 33b, and underlie $SiO_2$ film 31. An interlayer insulating film 37 is formed on the etching stopper layer 36. The structure described so far can be formed by processes similar to the first embodiment described with FIGS. 2A to 3.

By a method similar to the first embodiment described with FIG. 4, a contact hole 60 is formed in the interlayer insulating film 37, etching stopper layer 36, and anodic oxide film 35b. The anodic oxide film 35b is side etched and a hollow 61 is formed at the lower side wall of the contact hole 60. A depth of the hollow is generally the same as the thickness of the anodic oxide film 35b.

A Ti film 38d is deposited by sputtering on the surface of the interlayer insulating film 37 and the inner wall of the contact hole 60. Since Ti is likely to migrate on the underlie surface as compared to Al, the Ti film can be efficiently buried in the hollow 61. In order to completely bury the hollow 61, it is preferable to make the thickness of the Ti film 38d greater than the depth of the hollow 61, i.e., the thickness of the anodic oxide film 35b.

A drain wiring layer 38e of two layers of Al (lower layer) and Ti (upper layer) is deposited on the surface of the Ti film 38d by sputtering. The Ti film 38d and drain wiring layer 38e are patterned to form a drain wiring line.

As illustrated in FIG. 7A, before the drain wiring layer 38e is deposited, a film such as a Ti film likely to migrate during the film formation is deposited thicker than the depth of the hollow 61, i.e., the thickness of the anodic oxide film 35b. In this manner, the hollow 61 can be efficiently buried and the step coverage of the drain line can be prevented from being lowered.

Figure 7B:
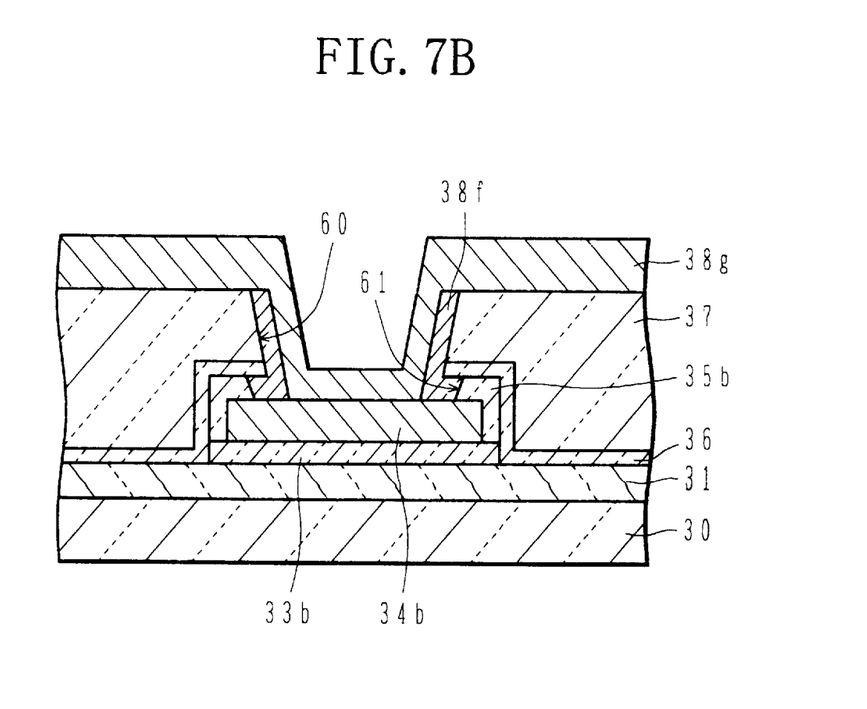

FIG. 7B is a cross sectional view showing the connection portion of a higher level wiring line and a lower level wiring line according to a modification of the second embodiment. In FIG. 7A, the Ti film 38d for burying the hollow 61 is formed over the whole surface of the substrate. In FIG. 7B, however, a Ti film is formed only on the side wall of a contact hole 60. The other structures are the same as the connection portion shown in FIG. 7A.

First, similar to FIG. 7A, a Ti film is deposited over the whole surface of the substrate. The Ti film on the flat surface is removed by anisotropic RIE using mixed gas of $Cl_2$ and $BCl_3$ as etching gas to thereby leave the Ti film 38f only on the side wall of the contact hole 60. A drain wiring layer 38g is deposited on the upper surface of the interlayer insulating film 37, on the surface of the Ti film 38f, and on the bottom surface of the contact hole 60, the drain wiring layer being made of three layers of Ti/Al/Ti. The drain wiring layer 38g is patterned to form a drain wiring line.

Also in the modification shown in FIG. 7B, the hollow 61 is buried with Ti before the drain wiring layer 38g is deposited so that it is possible to prevent the step coverage of the drain wiring layer from being lowered.

Since the interlayer insulating film, transparent pixel electrode, and the like are formed over the drain line 38c as shown in FIG. 5, it is preferable to make the drain line as thin as possible. In the second embodiment shown in FIG. 7A, since the Ti film 38b is formed under the drain wiring layer 38e, it is preferable to make the Ti film 38d thicker than the anodic oxide film 35b. It becomes therefore difficult to thicken the drain wiring layer 38e itself.

In the modification of the second embodiment shown in FIG. 7B, however, the Ti film 38f is left only on the side wall of the contact hole 60 and the Ti film on the interlayer insulating film 37 is removed. Therefore, the drain wiring layer 38g can be made relatively thick. The resistance of the drain line can be lowered easily because the resistivity of Al in the drain wiring layer is lower than that of Ti.

In the examples shown in FIGS. 7A and 7B, Ti is used for burying the hollow 61. Other materials may be used with expected similar advantageous effected, so long as they can migrate easier than Al which is used for the drain wiring layer. For example, TiN, Ta, Mo, W, and the like may be used. In the modification shown in FIG. 7B, the drain wiring layer 38g directly contacts the gate line 34b so that the hollow 61 may be buried with inorganic insulating material such as $SiO_2$.

In the first and second embodiments, Al is used as the material of the gate line. Al alloy may also be used such as, Al-Si, Al-Cu-Si, Al-Sc, and Al-Zr. The gate line may be made of Ta. In this case, an anodic oxide film having a composition of $Ta_2O_5$ is formed by anodically oxidizing the surface of the gate line.

In the first and second embodiments, a TFT type LCD is illustratively used for the connection of a gate line covered with an anodic oxide film and the higher level drain line. These embodiments are applicable generally to the connection of a lower level wiring covered with an insulating film and the higher level wiring disposed on the lower level wiring with the interposed interlayer insulating film. The embodiments are effective particularly for the case wherein the insulating film covering the lower level wiring is difficult to be anisotropically etched and therefore isotropical etching is used and a hollow is formed at the side wall of the contact hole.

The present invention has been described in connection with the preferred embodiments. The invention is not limited only to the above embodiments. It is apparent to those skilled in the art that various modifications, improvements, combinations and the like can be made without departing from the scope of the appended claims.

We claim:

1. An electronic circuit device comprising:

a substrate with an upper surface;

a lower level wiring made of conductive material and disposed above said substrate;

an insulating cover film covering the surface of said lower level wiring;

an interlayer insulating film formed on said substrate, covering said insulating cover film;

an opening formed through said interlayer insulating film and said insulating cover film at an interlayer contact region located above a portion of said lower level wiring, and having a length in a first direction substantially parallel to said upper surface of said substrate which at least partially overlaps a width of said lower level wiring in said first direction so as to expose a top surface and at least one side of said lower level wiring; and a higher level wiring disposed on a partial region of said interlayer insulating film and in the interlayer contact region, said higher level wiring being electrically connected to said lower level wiring in the interlayer contact region.

2. An electronic circuit device according to claim 1, wherein an etching resistance is different between the upper surface of said substrate and said interlayer insulating film, in the interlayer contact region.

3. An electronic circuit device according to claim 1, further comprising thin film transistors each comprising:

a channel film of semiconductor material formed on the upper surface of said substrate at a partial area thereof different from the interlayer contact region;

a gate insulating film of dielectric material formed on said channel film at said partial area thereof;

a gate electrode formed on said gate insulating film at the same time when said lower level wiring is deposited; and a gate covering film covering the surface of said gate electrode formed at the same time when said insulating cover film is formed, wherein the regions in said channel film on both sides of said gate electrode are low resistance regions, and said interlayer insulating film covers each thin film transistor.

4. An electronic circuit device according to claim 1, wherein said lower level wiring has a region disposed in a stripe pattern, and the interlayer contact region extends over a plurality of stripes of the stripe pattern at the stripe pattern region of said lower level wiring.

5. An electronic circuit device according to claim 1, wherein a portion exposing said insulating cover film at an inner side wall of said opening is retracted from a portion exposing said interlayer insulating film.

6. An electronic circuit device according to claim 3, further comprising a lower level insulating film disposed between the upper surface of said substrate and said lower level wiring, said lower level insulating film being deposited at the same time when said gate insulating film is deposited.

7. An electronic circuit device according to claim 3, further comprising:

a drain wiring disposed on said interlayer insulating film and electrically connected via a contact hole to one of the pair of low resistance regions of said channel film, said drain wiring being deposited at the same time when said upper level wiring; and a transparent electrode disposed above said interlayer insulating film and electrically connected via a contact hole to the other of the pair of low resistance regions of said channel film.

8. An electronic circuit device according to claim 7, wherein said channel film is made of polysilicon, said interlayer insulating film is made of silicon nitride, and the electronic circuit device further comprises an etching stopper film disposed between said channel film and said interlayer insulating film, said etching stopper film having an etching resistance different from both polysilicon and silicon nitride.

9. An electronic circuit device comprising:

a substrate with an upper surface:

a lower level wiring made of conductive material and disposed above said substrate:

an insulating cover film covering the surface of said lower level wiring:

an interlayer insulating film formed on said substrate, covering said insulating cover film:

an opening formed through said interlayer insulating film and said insulating cover film in a partial area located above a portion of said lower level wiring so as to expose a top surface of said lower level wiring;

a portion exposing said insulating cover film at the inner sidewall of said opening being retracted from a portion exposing said interlayer insulating film;

a buried material formed on a side wall of said opening, said buried material burying at least the whole region of the retracted portion of said insulating cover film, said buried material being made of metal more likely to migrate during metal film formation than said higher level wiring: and a higher level wiring disposed on said interlayer insulating film, in said opening and on the surface of said buried material, said hither level wiring being made of different material from said buried material and electrically connected to said lower level wiring in said opening, said electronic circuit device further comprising thin film transistors each comprising:

a channel film of semiconductor material formed on or above said substrate at a partial area thereof different from the surface region where said opening is formed;

a gate insulating film of dielectric material formed on said channel film at a partial area thereof;

a gate electrode formed on said gate insulating film at a same time when said lower level wiring is deposited; and a gate covering film covering the surface of said gate electrode formed at a same time when said insulating cover film is formed, wherein the regions in said channel film on both sides of said gate electrode are low resistance regions, and said interlayer insulating film covers each thin film transistor.

said electronic circuit device further comprising:

a drain wiring disposed on or above said interlayer insulating film and electrically connected via a contact hole to one of the pair of low resistance regions of said channel film, said drain wiring being deposited at the same time when said upper level wiring; and a transparent electrode disposed on or above said interlayer insulating film and electrically connected via a contact hole to the other of the pair of low resistance regions of said channel film, wherein said channel film is made of polysilicon, said interlayer insulating film is made of silicon nitride, and the electronic circuit device further comprises an etching stopper film disposed between said channel film and said interlayer insulating film, said etching stopper film having an etching resistance different from both polysilicon and silicon nitride.

* * * * *